(12) United States Patent
Chang et al.

(10) Patent No.: US 11,817,503 B2
(45) Date of Patent: Nov. 14, 2023

(54) SEMICONDUCTOR DEVICE

(71) Applicant: TAIWAN SEMICONDUCTOR MANUFACTURING CO., LTD., Hsinchu (TW)

(72) Inventors: Che-Cheng Chang, New Taipei (TW); Chih-Han Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/875,152

(22) Filed: Jul. 27, 2022

(65) Prior Publication Data
US 2022/0367719 A1    Nov. 17, 2022

Related U.S. Application Data

(60) Continuation of application No. 17/098,046, filed on Nov. 13, 2020, now Pat. No. 11,424,366, which is a continuation of application No. 16/716,207, filed on Dec. 16, 2019, now Pat. No. 10,840,379, which is a continuation of application No. 16/041,664, filed on
(Continued)

(51) Int. Cl.
| H01L 29/00 | (2006.01) |
| H01L 29/78 | (2006.01) |
| H01L 29/423 | (2006.01) |
| H01L 29/51 | (2006.01) |
| H01L 29/66 | (2006.01) |

(52) U.S. Cl.
CPC .... *H01L 29/7851* (2013.01); *H01L 29/42356* (2013.01); *H01L 29/517* (2013.01); *H01L 29/518* (2013.01); *H01L 29/6656* (2013.01); *H01L 29/66545* (2013.01); *H01L 29/66795* (2013.01); *H01L 29/785* (2013.01)

(58) Field of Classification Search
CPC .......... H01L 29/4236; H01L 29/42356; H01L 29/785; H01L 29/66795
See application file for complete search history.

(56) References Cited

U.S. PATENT DOCUMENTS

| 9,583,600 B1 | 2/2017 | Lin |
| 10,032,914 B2 | 7/2018 | Chang et al. |
| (Continued) | | |

FOREIGN PATENT DOCUMENTS

| CN | 103855093 A | 6/2014 |
| CN | 104160507 A | 11/2014 |
| TW | 201334158 A1 | 8/2013 |

*Primary Examiner* — Reema Patel
(74) *Attorney, Agent, or Firm* — Maschoff Brennan

(57) ABSTRACT

A device includes a substrate, a shallow trench isolation (STI) structure, an isolation structure, and a gate stack. The substrate has a semiconductor fin. The shallow trench isolation (STI) structure is over the substrate and laterally surrounding the semiconductor fin. The isolation structure is disposed on a top surface of the STI structure. The gate stack crosses the semiconductor fin, over the STI structure, and in contact with a sidewall the isolation structure, in which the gate stack includes a high-k dielectric layer extending from a sidewall of the semiconductor fin to the top surface of the STI structure and terminating prior to reaching the sidewall of the isolation structure, and the high-k dielectric layer is in contact with the top surface of the STI structure. The gate stack includes a gate electrode over the high-k dielectric layer and in contact with the sidewall of the isolation structure.

20 Claims, 12 Drawing Sheets

Related U.S. Application Data

Jul. 20, 2018, now Pat. No. 10,510,896, which is a division of application No. 14/887,873, filed on Oct. 20, 2015, now Pat. No. 10,032,914.

(56) References Cited

U.S. PATENT DOCUMENTS

| | | |
|---|---|---|
| 2005/0056892 A1 | 3/2005 | Seliskar |
| 2011/0272753 A1 | 11/2011 | Funayama et al. |
| 2011/0298053 A1 | 12/2011 | Zhong et al. |
| 2013/0270559 A1 | 10/2013 | Hafez et al. |
| 2013/0270655 A1 | 10/2013 | Adam et al. |
| 2014/0239393 A1 | 8/2014 | Kuo et al. |
| 2014/0319623 A1 | 10/2014 | Tsai et al. |
| 2015/0102409 A1 | 4/2015 | Cheng et al. |
| 2015/0115334 A1 | 4/2015 | Liaw |
| 2015/0243773 A1 | 8/2015 | Basu et al. |
| 2015/0255557 A1 | 9/2015 | Zhu et al. |
| 2016/0111426 A1 | 4/2016 | Tsai et al. |

SEMICONDUCTOR DEVICE

PRIORITY CLAIM AND CROSS-REFERENCE

This application is a Continuation application of U.S. patent application Ser. No. 17/098,046, filed Nov. 13, 2020, which is a Continuation application of U.S. patent application Ser. No. 16/716,207, filed Dec. 16, 2019, now U.S. Pat. No. 10,840,379, issued Nov. 17, 2020, which is a continuation of U.S. patent application Ser. No. 16/041,664, filed Jul. 20, 2018, now U.S. Pat. No. 10,510,896, issued Dec. 17, 2019, which is a Divisional application of U.S. patent application Ser. No. 14/887,873, filed Oct. 20, 2015, now U.S. Pat. No. 10,032,914, issued Jul. 24, 2018, which are herein incorporated by reference in their entireties.

BACKGROUND

As the semiconductor industry has progressed into nanometer technology process nodes in pursuit of higher device density, higher performance, and lower costs, challenges from both fabrication and design issues have resulted in the development of three dimensional designs, such as a fin-like field effect transistor (FinFET). A FinFET includes an extended semiconductor fin that is elevated above a substrate in a direction normal to the plane of the substrate. The channel of the FET is formed in this vertical fin. A gate is provided over (e.g., wrapping) the fin. The FinFETs further can reduce the short channel effect.

BRIEF DESCRIPTION OF THE DRAWINGS

Aspects of the presented disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 9A are top views of a method for manufacturing a semiconductor device at various stages in accordance with some embodiments of the presented disclosure.

FIGS. 1B to 9B are cross-sectional views respectively taking along line B-B of FIGS. 1A to 9A.

FIGS. 10A to 12A are top views of a method for manufacturing a semiconductor device at various stages in accordance with some embodiments of the presented disclosure.

FIGS. 10B to 12B are cross-sectional views respectively taking along line B-B of FIGS. 11A to 12A.

DETAILED DESCRIPTION

Figure 1A:
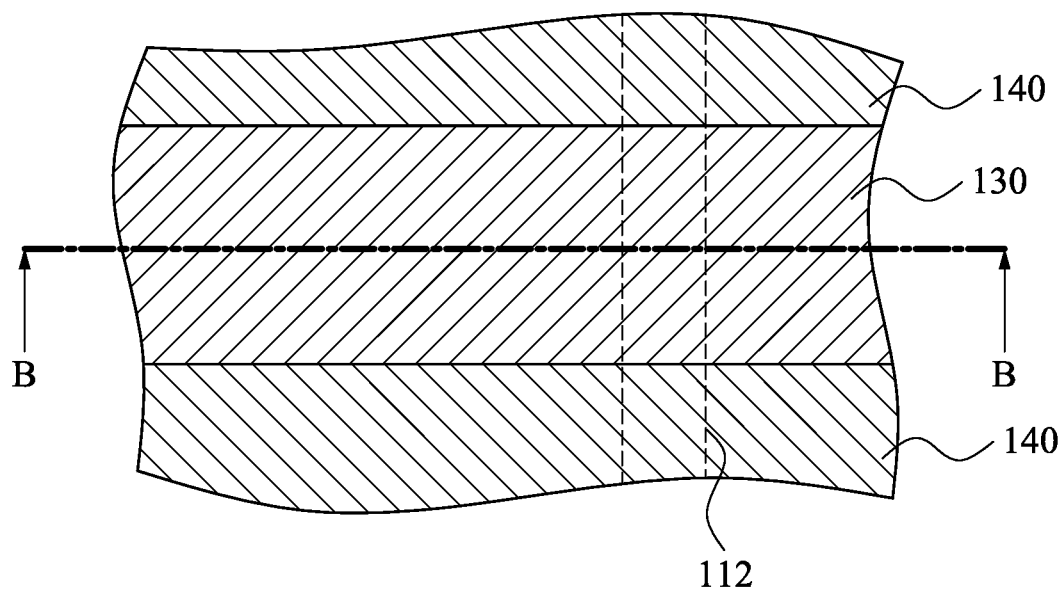

The following disclosure provides many different embodiments, or examples, for implementing different features of the provided subject matter. Specific examples of components and arrangements are described below to simplify the presented disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the presented disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the presented disclosure provide some improved methods for the formation of semiconductor devices and the resulting structures. These embodiments are discussed below in the context of forming finFET transistors having a single fin or multiple fins on a bulk silicon substrate. One of ordinary skill in the art will realize that embodiments of the presented disclosure may be used with other configurations.

Figure 1B:
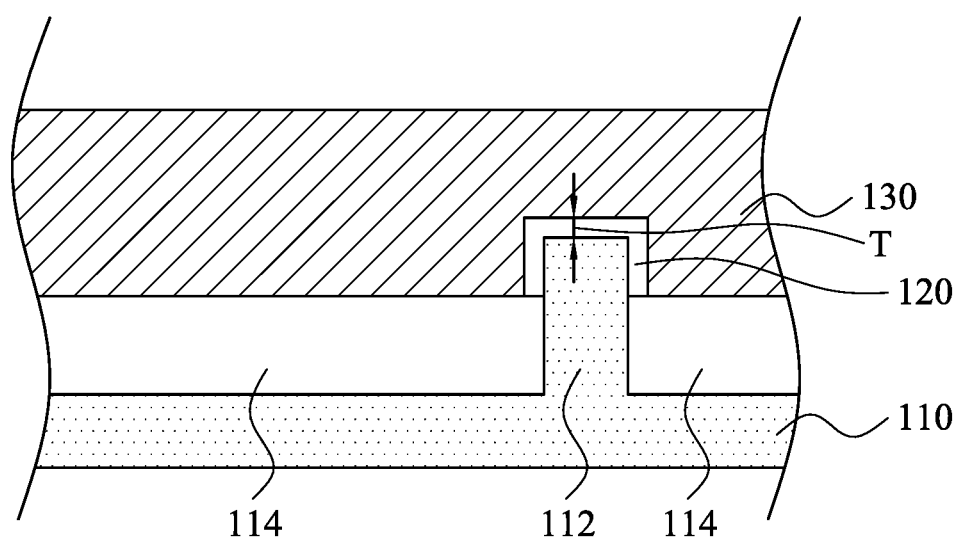

FIGS. 1A to 9A are top views of a method for manufacturing a semiconductor device at various stages in accordance with some embodiments of the presented disclosure, and FIGS. 1B to 9B are cross-sectional views respectively taking along line B-B of FIGS. 1A to 9A. Reference is made to FIGS. 1A and 1B. A substrate 110 is provided. The substrate 110 includes a semiconductor fin 112 protruded from a top surface 111 of the substrate 110. In some embodiments, the semiconductor fin 112 includes silicon. It is note that the numbers of the semiconductor fin 112 in FIGS. 1A and 1B are illustrative, and should not limit the claimed scope of the presented disclosure. A person having ordinary skill in the art may select suitable numbers for the semiconductor fin 112 according to actual situations.

In some embodiments, the substrate 110 may be a semiconductor material and may include known structures including a graded layer or a buried oxide, for example. In some embodiments, the substrate 110 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 110. Alternatively, the silicon substrate 110 may be an active layer of a semiconductor-on-insulator (SOI) substrate or a multi-layered structure such as a silicon-germanium layer formed on a bulk silicon layer.

The semiconductor fin 112 may be formed, for example, by patterning and etching the substrate 110 using photolithography techniques. In some embodiments, a layer of photoresist material (not shown) is deposited over the substrate 110. The layer of photoresist material is irradiated (exposed) in accordance with a desired pattern (the semiconductor fin 112 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

In some other embodiments, the semiconductor fin 112 may be epitaxially grown. For example, exposed portions of an underlying material, such as an exposed portion of the substrate 110, may be used in an epitaxial process to form the semiconductor fin 112. A mask may be used to control the shape of the semiconductor fin 112 during the epitaxial growth process.

In FIG. 1B, a plurality of isolation structures 114 are formed on the substrate 110 and adjacent to the semiconductor fin 112. The isolation structures 114, which act as a shallow trench isolation (STI) around the semiconductor fin 112, may be formed by chemical vapor deposition (CVD) techniques using tetra-ethyl-ortho-silicate (TEOS) and oxygen as a precursor. In some other embodiments, the isolation structures 114 may be formed by implanting ions, such as oxygen, nitrogen, carbon, or the like, into the substrate 110. In yet some other embodiments, the isolation structures 114 are insulator layers of a SOI wafer.

In FIG. 1B, a gate insulating film 120 is formed on the semiconductor fin 112. The gate insulating film 120, which prevents electron depletion, may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. Some embodiments may include hafnium oxide ($HfO_2$) hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. The gate insulating film 120 may have a multilayer structure such as one layer of silicon oxide (e.g., interfacial layer) and another layer of high-k material. The gate insulating film 120 may have a thickness T ranging from about 10 to about 30 angstroms (Å). The gate insulating film 120 may be formed using CVD, physical vapor deposition (PVD), atomic layer deposition (ALD), thermal oxide, ozone oxidation, other suitable processes, or combinations thereof.

CVD is a technique of thin solid film deposition on substrates from the vapor species through chemical reactions. The chemical reaction is one of distinctive features that CVD possesses compared with other film deposition techniques such as PVD. A tube-furnace CVD system for may include a gas delivery system, a reactor, and a gas removal system. During the CVD process, reactive gas species are fed into the reactor by the gas delivery system through valves. A gas-mixing unit may mix the various gases before they are let in the reactor. The reactor is where the chemical reaction takes place and the solid materials are deposited on substrates as the purpose of the reaction. The heaters are placed surrounding the reactor to provide high temperatures for the reaction. The by-products of the reaction and non-reacted gases are removed by the gas removal system. PVD is a deposition method which involves physical processes such as a plasma sputter bombardment rather than involving a chemical reaction at the surface. In the plasma sputter process, atoms or molecules are ejected from a target material by high-energy particle bombardment so that the ejected atoms or molecules can condense on a substrate as a thin film. ALD is a gas phase chemical process and it is a self-limiting atomic layer-by-layer growth method. The surface-controlled growth mechanism of ALD provides good step coverage and dense films with few (or no) pinholes. The precision achieved with ALD allows processing of thin films in a controlled way in the nanometer scale.

In FIGS. 1A and 1B, a dummy layer 130 is formed on the substrate 110 to cover the gate insulating film 120 and the semiconductor fin 112. In other words, the gate insulating film 120 is disposed between the dummy layer 130 and the semiconductor fin 112 of the substrate 110. In some embodiments, the dummy layer 130 includes a semiconductor material such as polysilicon, amorphous silicon, or the like. The dummy layer 130 may be deposited doped or undoped. For example, in some embodiments, the dummy layer 130 includes polysilicon deposited undoped by low-pressure chemical vapor deposition (LPCVD). The polysilicon may also be deposited, for example, by furnace deposition of an in-situ doped polysilicon. Alternatively, the dummy layer 130 may includes other suitable materials.

In some embodiments, as shown in FIG. 1A, a plurality of gate spacers 140 are formed on opposing sides of the dummy layer 130. In some embodiments, at least one of the gate spacers 140 includes single or multiple layers. The gate spacers 140 can be formed by blanket depositing one or more dielectric layer(s) (not shown) on the previously formed structure. The dielectric layer(s) may include silicon nitride (SiN), oxynitride, silicion carbon (SiC), silicon oxynitride (SiON), oxide, and the like and may be formed by methods utilized to form such a layer, such as CVD, plasma enhanced CVD, sputter, and other methods known in the art. The gate spacers 140 may include different materials with different etch characteristics than the dummy layer 130 so that the gate spacers 140 may be used as masks for the patterning of the dummy layer 130 (described below with references to FIGS. 3A-3B). The gate spacers 140 may then be patterned, such as by one or more etches to remove the portions of the gate spacers 140 from the horizontal surfaces of the structure.

Figure 2A:
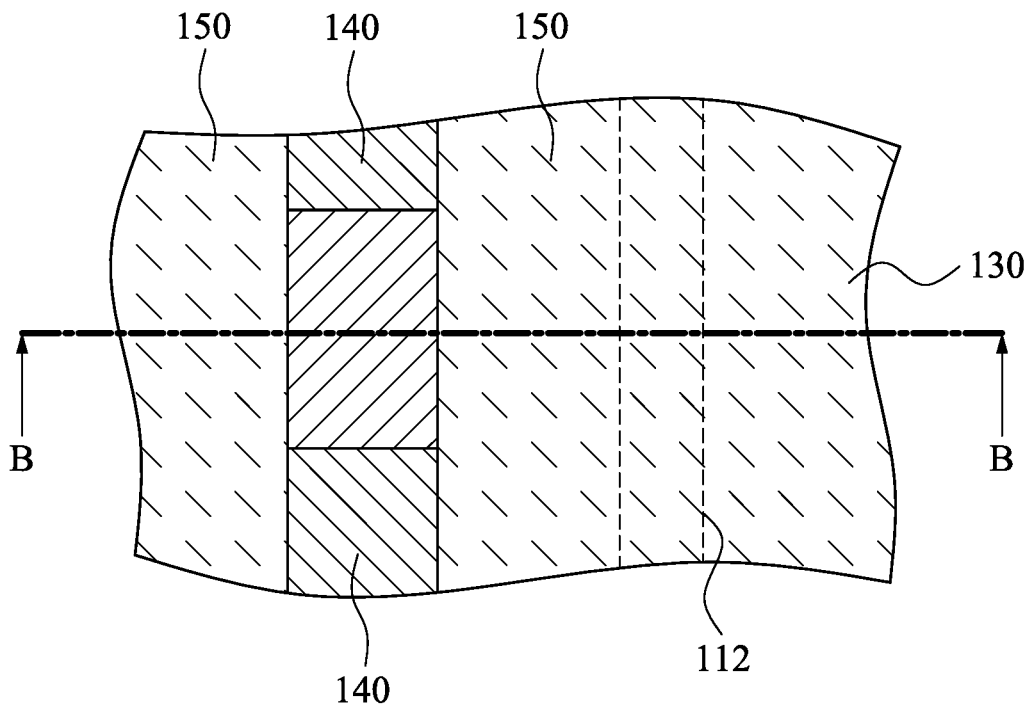
Figure 2B:
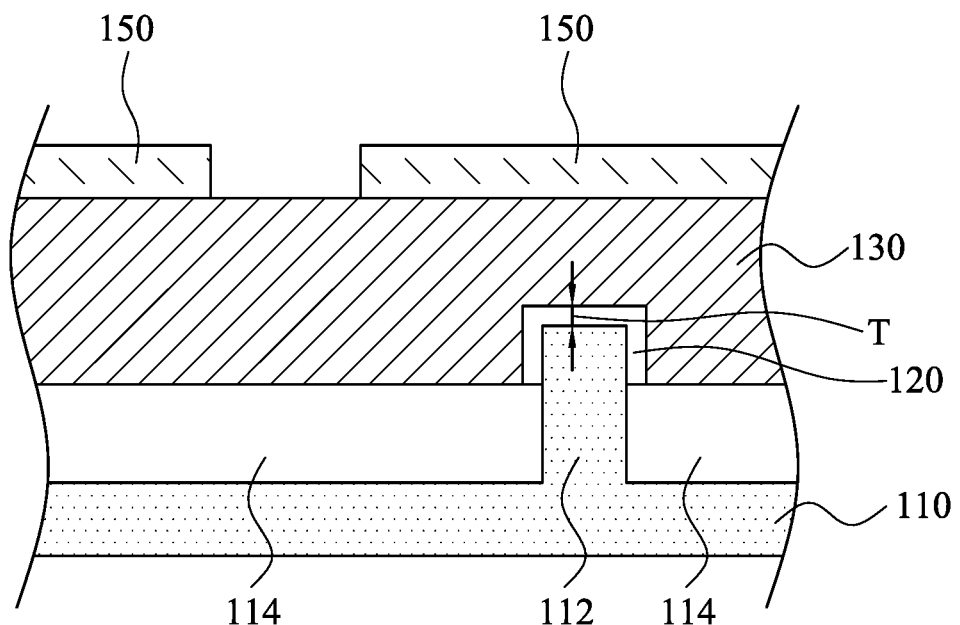

Reference is made to FIGS. 2A and 2B. A mask is formed over the dummy layer 130 and the semiconductor fin 112, and is patterned to form a patterned mask 150, which defines an insulation area between gate stacks 105 (see FIGS. 9A and 9B), i.e., to define the ends of the gate stacks 105. In some embodiments, the patterned mask 150 is a photoresist mask formed by depositing, exposing, and developing a layer of photoresist material. The patterned mask 150 forms the insulation area between the gate stacks 105 in subsequent processing steps as discussed in greater detail below.

Figure 3A:
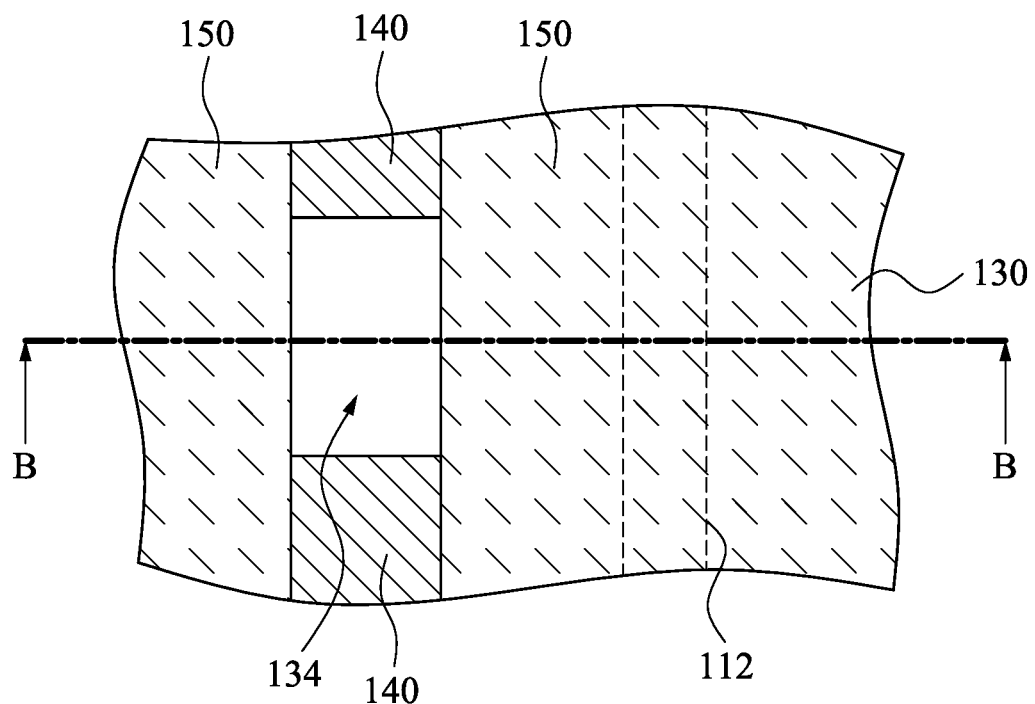
Figure 3B:
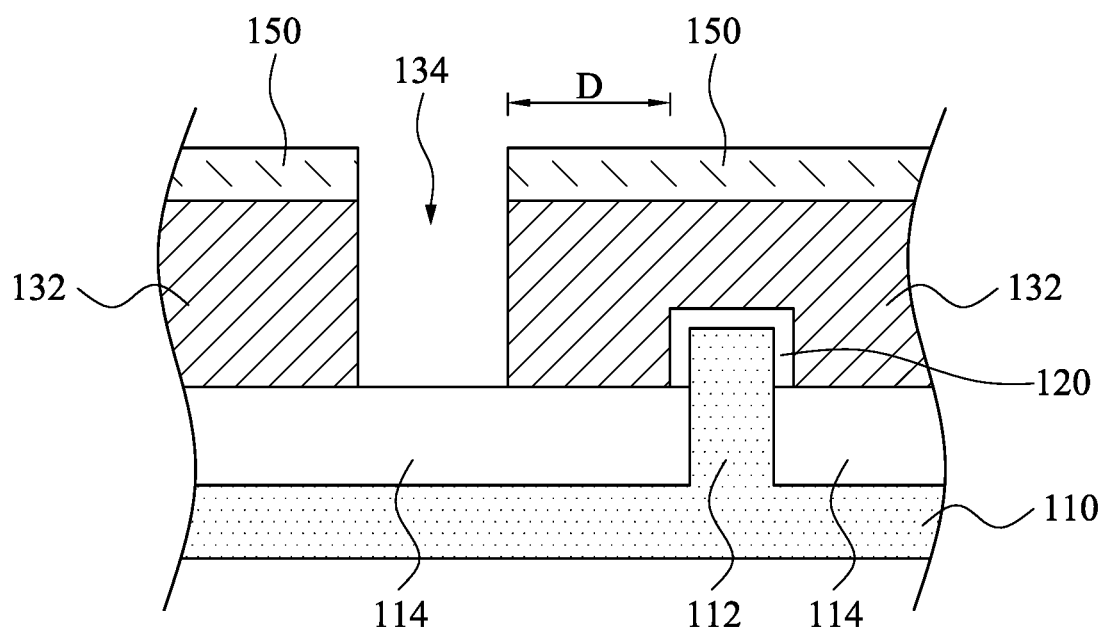

Reference is made to FIGS. 3A and 3B. The dummy layer 130 (see FIGS. 2A and 2B) is partially removed (or patterned) in the regions exposed by the patterned mask 150 (i.e., the insulation area) by an etching back process or other suitable process to form patterned dummy layers 132. For example, the dummy layer 130 may be selectively etched thereby forming a through hole 134 between the gate spacers 140 (see FIG. 3A) and between the patterned dummy layers 132 (see FIG. 3B). The through hole 134 is laterally separated from the semiconductor fin 112 by a distance D. At least one of the patterned dummy layers 132 covers the semiconductor fin 112. The portion of the dummy layer 130 exposed by the patterned mask 150 may be removed by a wet etch process that includes exposure to hydroxide containing solution (e.g., ammonium hydroxide), deionized water, and/or other suitable etchant solutions.

Figure 4A:
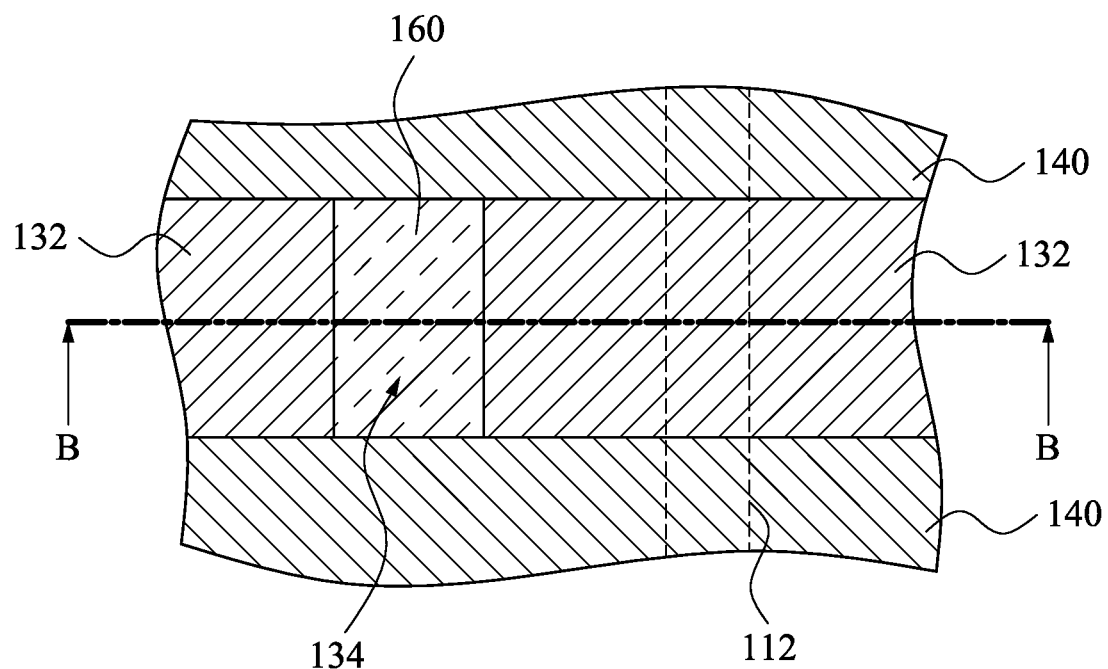
Figure 4B:
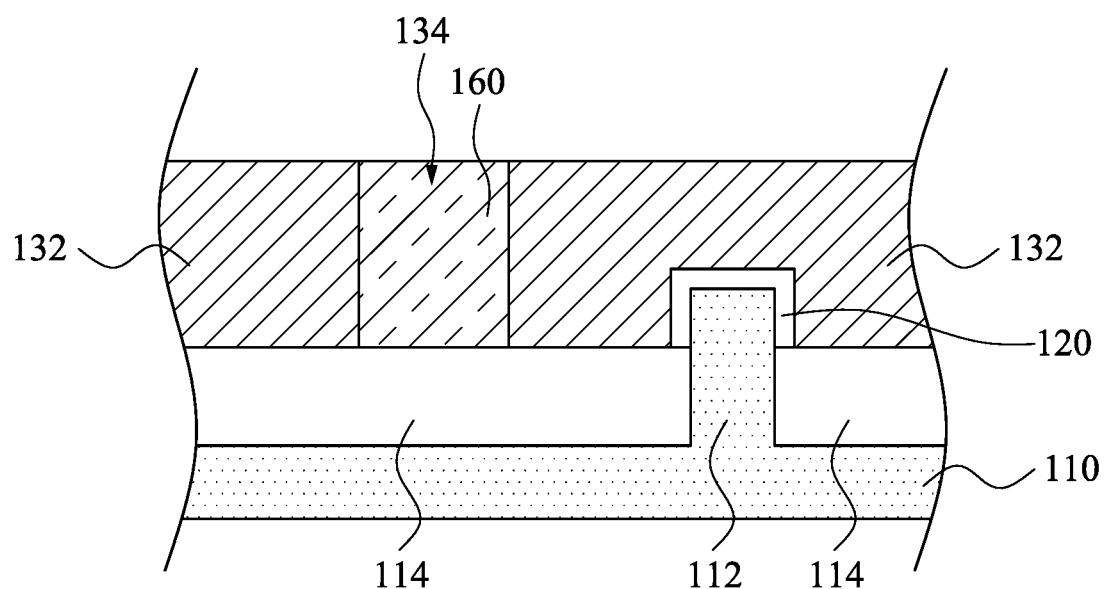

Reference is made to FIGS. 4A and 4B. The patterned mask 150 (see FIGS. 3A and 3B) is removed by an ashing, stripping, or other suitable technique. Then, an insulating structure 160 is disposed in the through hole 134. The insulating structure 160 may be a plug which is surrounded by the gate spacers 140 and the patterned dummy layers 132. For example, an inter-layer dielectric (ILD) (not shown) is formed over the patterned dummy layers 132 and in the through hole 134. A chemical mechanical planarization (CMP) process may then be performed to etch back and planarize the ILD to form the insulating structure 160. In some embodiments, the ILD is formed of an oxide such as phospho-silicate glass (PSG), boro-silicate glass (BSG), boron-doped phospho-silicate glass (BPSG), TEOS, or the like.

Figure 5A:
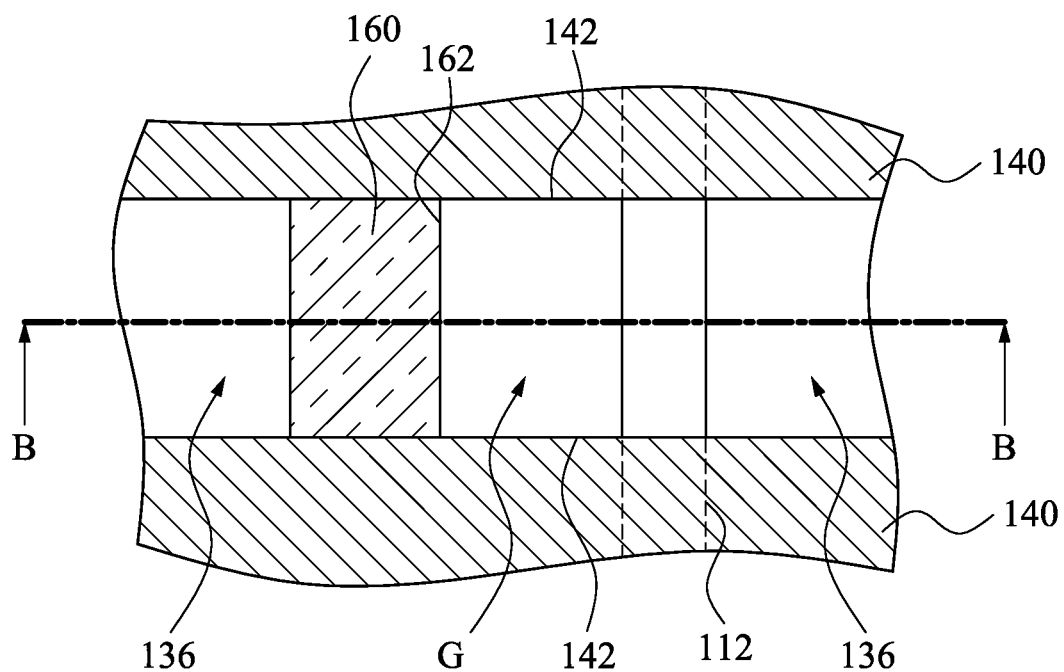
Figure 5B:
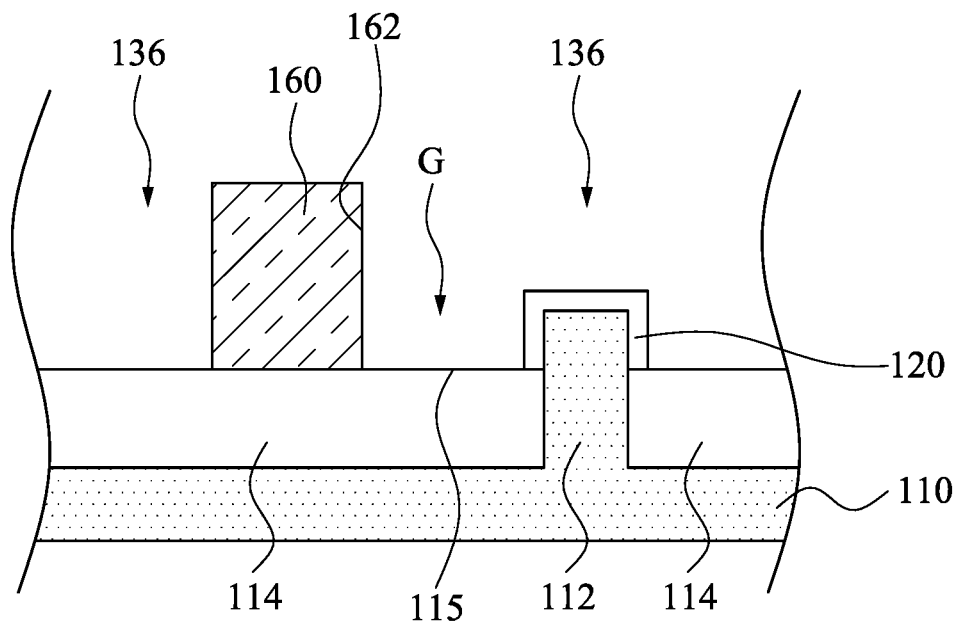

Reference is made to FIGS. 5A and 5B. For clarity, the gate insulating film 120 is depicted in FIG. 5B and is omitted in FIG. 5A. The patterned dummy layers 132 (see FIGS. 4A and 4B) are removed by an etching back process or other suitable process to form openings 136 on opposite sides of the insulating structure 160 and between the gate spacers 140. One of the openings 136 exposes a portion of the gate insulating film 120 disposed on the semiconductor fin 112, and a gap G is formed in the opening 136 and between the insulating structure 160 and the semiconductor fin 112. Furthermore, at least a sidewall 162 of the insulating structure 160 facing the semiconductor fin 112 and sidewalls 142 of the gate spacers 140 are exposed. The gap G has inner surfaces, such as the sidewall 162, the sidewalls 142, and a bottom surface 115. The patterned dummy layers 132 may be removed by a wet etch process that includes exposure to hydroxide containing solution (e.g., ammonium hydroxide), deionized water, and/or other suitable etchant solutions.

It is noted that although in the insulating structure 160 of FIGS. 5A and 5B is formed according to the manufacturing processes of FIGS. 1A to 5B, the claimed scope of the presented disclosure is not limited in this respect. In some other embodiments, the insulating structure 160 can be formed by forming an insulating layer on the gate insulating film 120 and then patterning it without forming the dummy layer 130 (see FIGS. 1A and 1B).

Figure 6A:
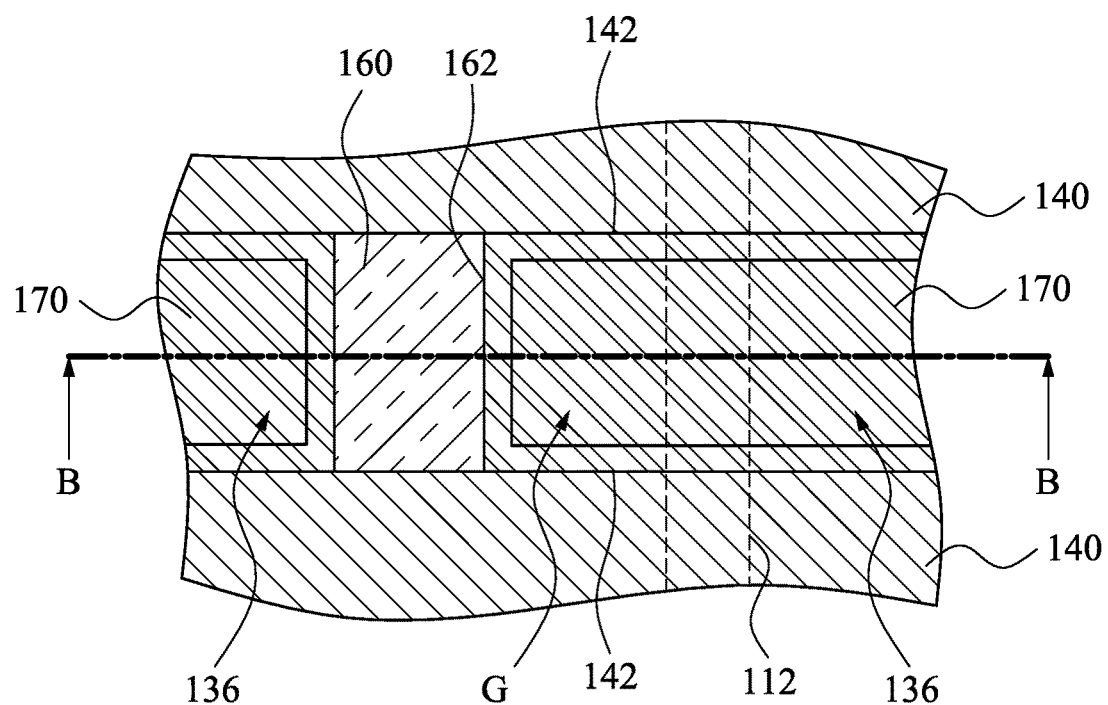
Figure 6B:
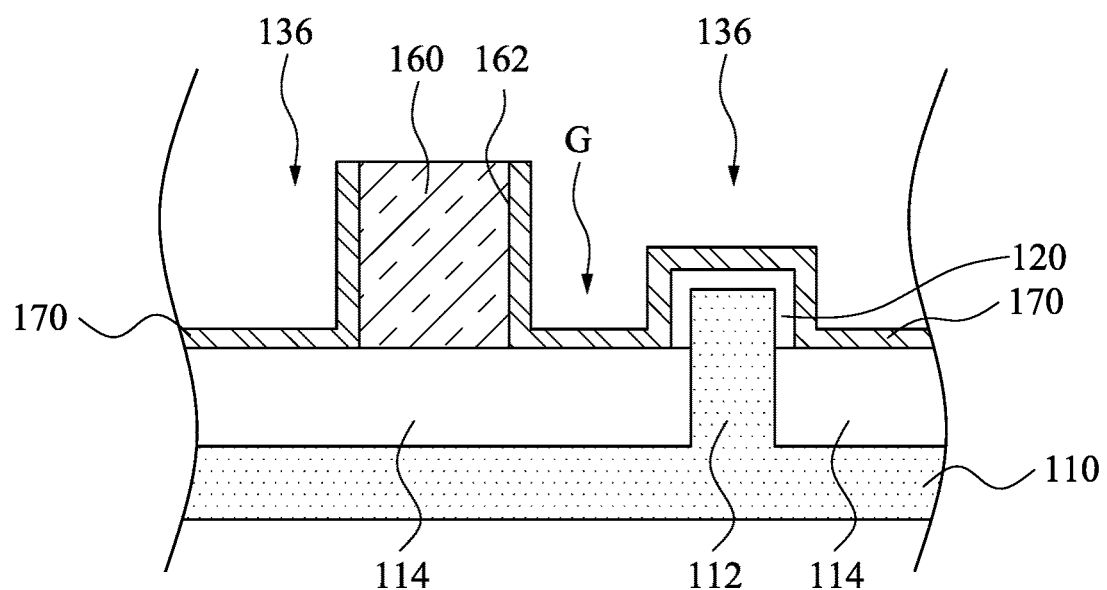

Reference is made to FIGS. 6A and 6B. A high dielectric constant (high-κ) dielectric layer 170 is conformally formed in the openings 136. Therefore, the high-κ dielectric layer 170 covers the semiconductor fin 112, the bottom surface 115 of the gap G, and the sidewall 162 of the insulating structure 160 facing the semiconductor fin 112. In addition, the high-κ dielectric layer 170 further covers the sidewalls 142 of the gate spacers 140. In some embodiments, another interfacial layer is deposited first if the interfacial layer 120 of FIG. 1B is removed in a previous process step. The high-κ dielectric layer 170 has a dielectric constant (κ) higher than the dielectric constant of $SiO_2$, i.e. κ>3.9. The high-κ dielectric layer 170 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The high-K dielectric layer 170 is deposited by suitable techniques, such as ALD, CVD, PVD, thermal oxidation, combinations thereof, or other suitable techniques.

Figure 7A:
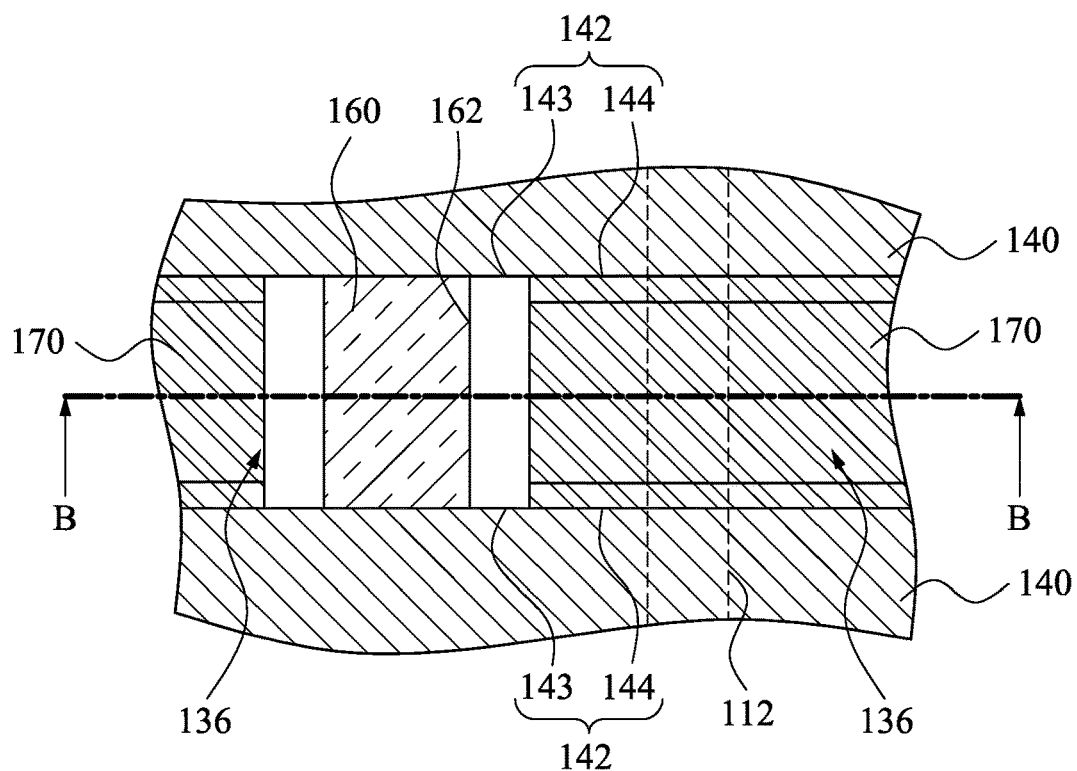
Figure 7B:
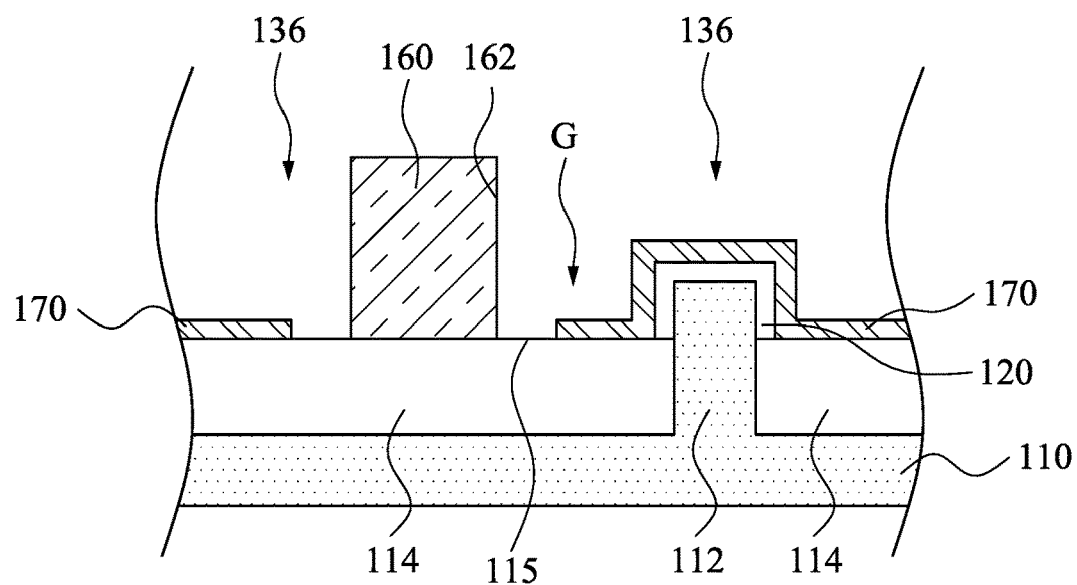

Reference is made to FIGS. 7A and 7B. Subsequently, the high-K dielectric layer 170 is partially removed to expose the sidewall 162 of the insulating structure 140, a portion of the bottom surface 115 of the gap G, and first portions 143 of the sidewalls 142 of the gate spacers 140 while covers second portions 144 of the sidewalls 142 of the gate spacers 140. The first portion 143 of the sidewall 142 of the gate spacer 140 is present adjacent to the sidewall 162 of the insulating structure 160 and between the second portion 144 of the gate spacer 140 and the insulating structure 160. In other words, the high-κ dielectric layer 170 is separated from the insulating structure 160. The high-κ dielectric layer 170 may be partially removed by etching the high-κ dielectric layer 170. The etching process includes dry etch, wet etch, or a combination of dry and wet etch. The etching process may include a multiple-operation etching to gain etch selectivity, flexibility and desired etch profile.

Figure 8A:
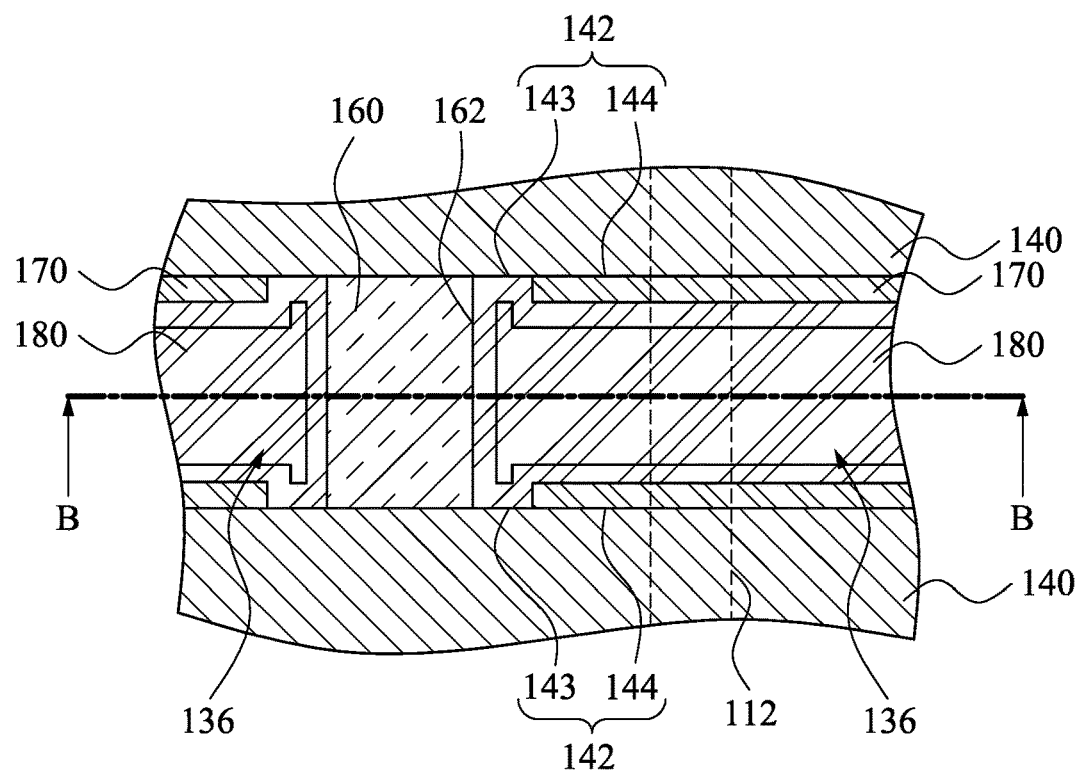
Figure 8B:
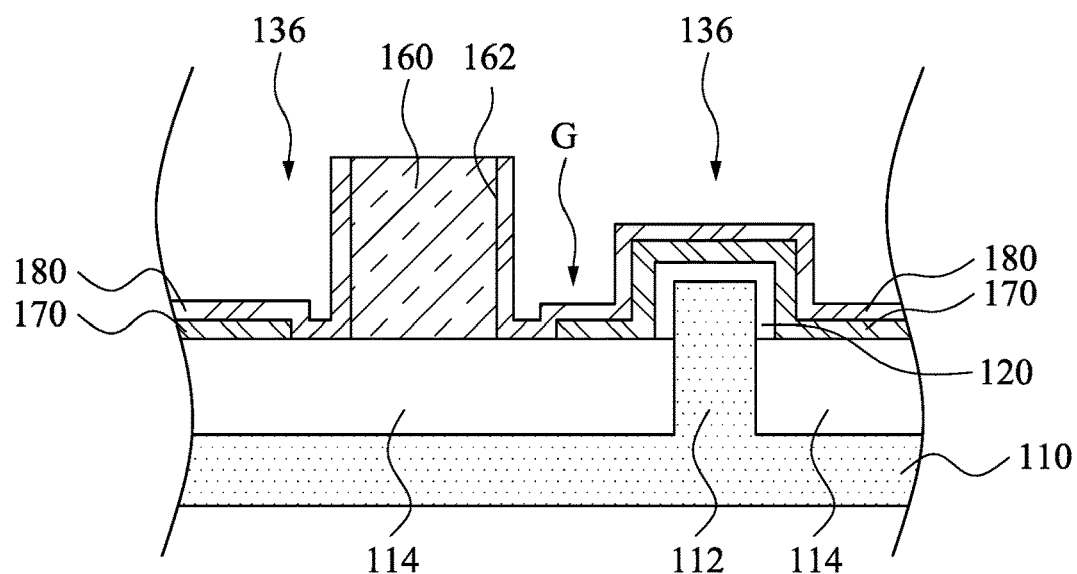

Reference is made to FIGS. 8A and 8B. A metal layer 180 is conformally formed in the openings 136 and on the high-κ dielectric layer 170. In other words, the metal layer 180 covers the high-κ dielectric layer 170. Therefore, the metal layer 180 attaches to the sidewall 162 of the insulating structure 160, the bottom surface 115 of the gap G, and the first portions 143 of the sidewalls 142 of the gate spacers 140. The metal layer 180 may be a work-function (WF) metal layer. In some embodiments, the WF metal layer can include impurities. For example, the impurity used in providing an N-type work-function shift is an element from the Lanthanide group. Examples of P-type WF metal layer may include, but not limited to, Re, Fe, Ru, Co, Rh, Ir, Ni, Pd, and Pt. Pd can be used as an impurity in a P-type WF layer. The metal layer 180 may be formed by depositing WF metal materials in the openings 136. The metal layer 180 may include a single layer or multi layers, such as a WF layer, a liner layer, a wetting layer, and an adhesion layer. The metal layer 180 may include Ti, TiAlN, TaC, TaCN, TaSiN, Mn, Zr, TiN, TaN, Ru, Mo, WN, or any suitable materials. The metal layer 180 may be formed by ALD, PVD, CVD, or other suitable process.

Figure 9A:
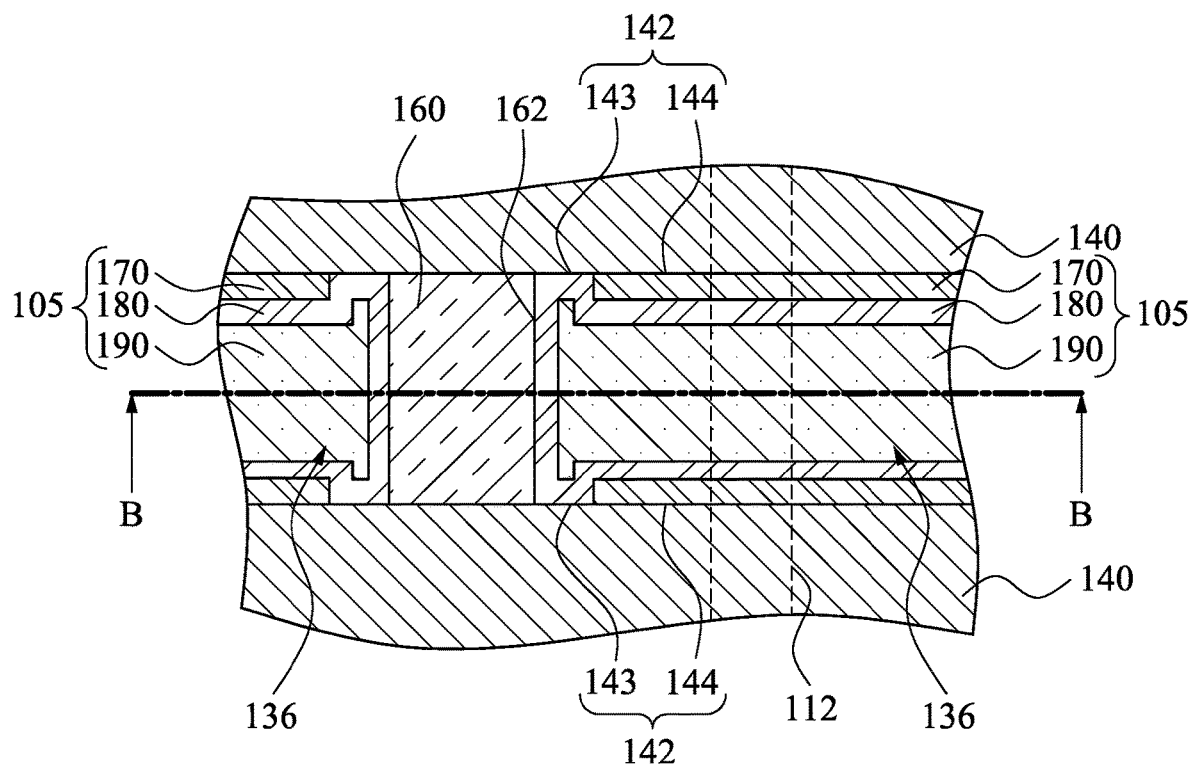
Figure 9B:
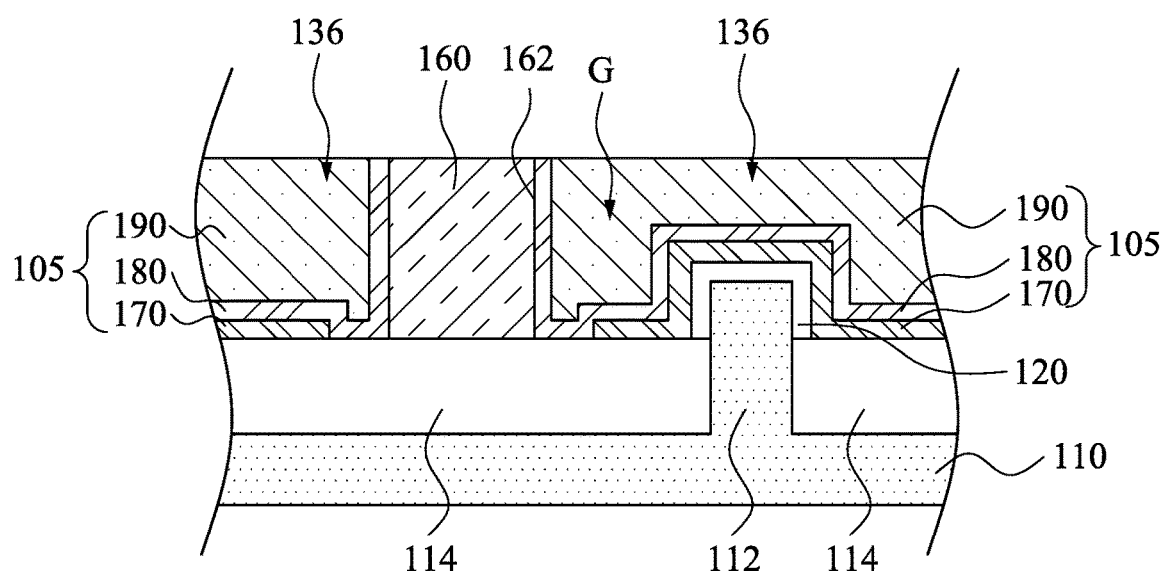

Reference is made to FIGS. 9A and 9B. A gate electrode 190 is formed on the metal layer 180 and fills the opening 136. Furthermore, the gate electrode 190 at least disposed in the gap G between the insulating structure 160 and the semiconductor fin 112. The gate electrode 190 may include aluminum (Al), copper (Cu), AlCu, tungsten (W) or other suitable conductive material. The gate electrode 190 is deposited by ALD, PVD, CVD, or other suitable process. With the gate electrode 190, the metal layer 180, and the high-κ dielectric layer 170, a gate stack 105 is formed. In some embodiments, a metal CMP process is applied to remove excessive the gate electrode 190 to provide a substantially planar top surface for the gate stack 105, the insulating structure 160, and the gate spacer 140. Hence, the gate stack 105 and the semiconductor fin 112 can form a fin field effect transistor (finFET). The process from FIGS. 5A to 9B is referred as a replacement gate loop process. Furthermore, if the patterned dummy layer 132 of FIGS. 4A and 4B is made of polysilicon, the process from FIGS. 5A to 9B is referred as a replacement polysilicon gate (RPG) loop process.

According to the aforementioned embodiments, the insulating structure is disposed between two adjacent gate stacks to isolate the two adjacent gate stacks. Since at least a portion of the high-κ dielectric layer covering the sidewall of the insulating structure is removed before the formations of the metal layer and the gate electrode, the depositing windows for the metal layer and the gate electrode is enlarged. In addition, the size of the gap between the insulating structure and the semiconductor fin is also enlarged. Hence, the gate electrode can fill the gap between the insulating structure and the semiconductor fin, reducing the probability of formation of void therein. With this configuration, the voltage performance of the gate stack can be improved.

Figure 10A:
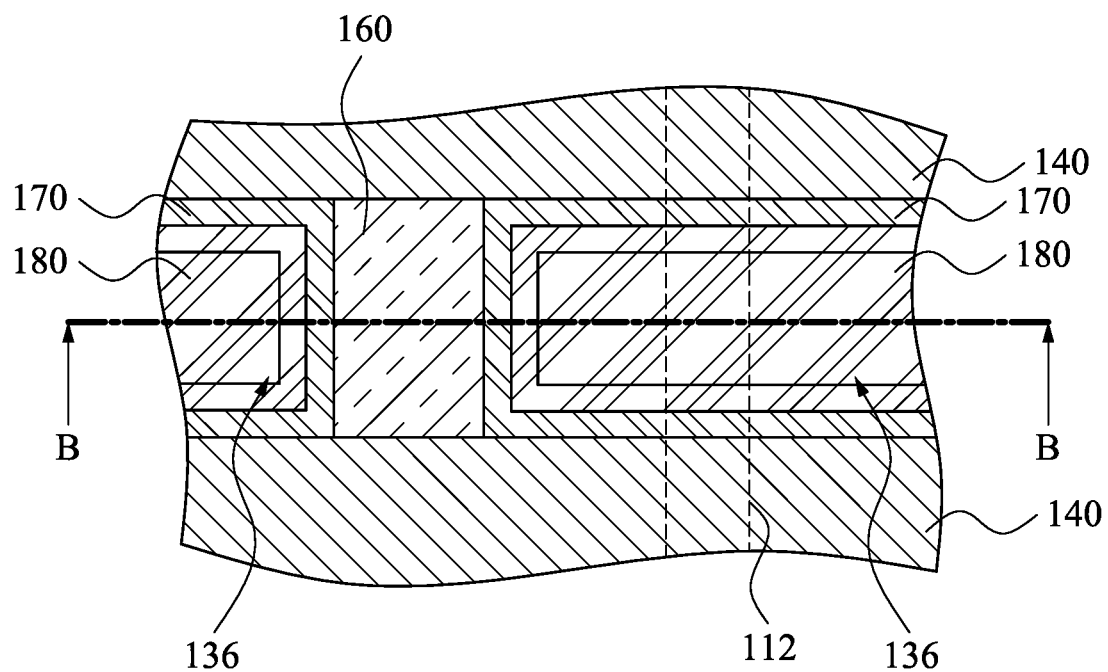
Figure 10B:
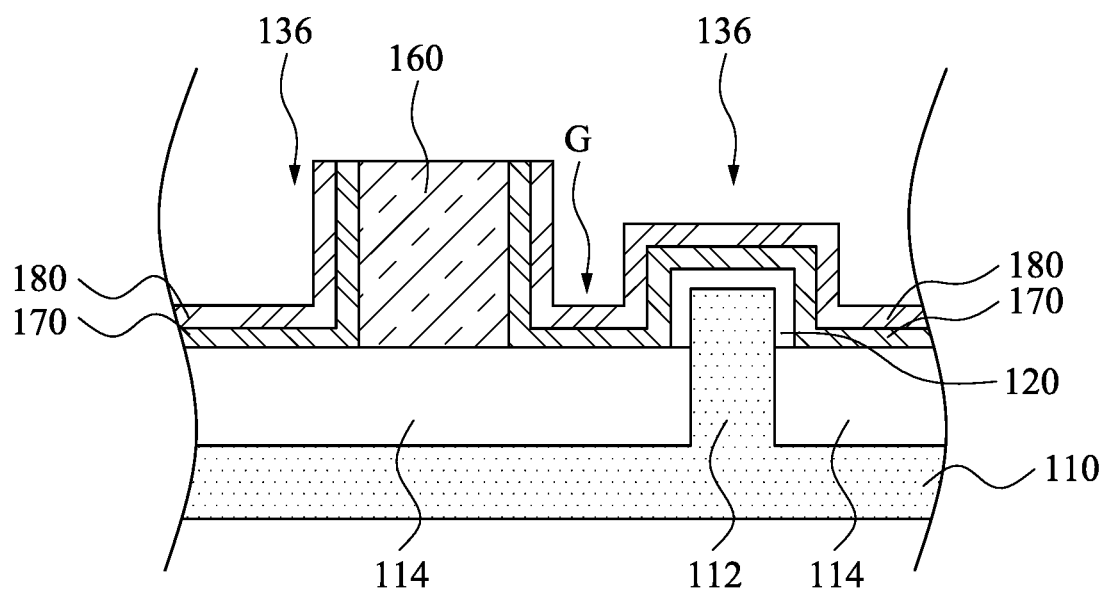

FIGS. 10A to 12A are top views of a method for manufacturing a semiconductor device at various stages in accordance with some embodiments of the presented disclosure, and FIGS. 10B to 12B are cross-sectional views respectively taking along line B-B of FIGS. 10A to 12A. The manufacturing processes of FIGS. 1A to 6B are performed in advance. Since the relevant manufacturing details are similar to the abovementioned embodiments, and, therefore, a description in this regard will not be repeated hereinafter. Reference is made to FIGS. 10A and 10B. A metal layer 180 is conformally formed in the openings 136 and on the high-κ dielectric layer 170. In other words, the metal layer 180 covers the high-κ dielectric layer 170. The metal layer 180 may be a work-function (WF) metal layer. In some embodiments, the WF metal layer can include impurities. For example, the impurity used in providing an N-type work-function shift is an element from the Lanthanide group. Examples of P-type WF metal layer may include, but not limited to, Re, Fe, Ru, Co, Rh, Ir, Ni, Pd, and Pt. Pd can be used as an impurity in a P-type WF layer. The metal layer 180 may be formed by depositing WF metal materials in the openings 136. The metal layer 180 may include a single layer or multi layers, such as a WF layer, a liner layer, a wetting layer, and an adhesion layer. The metal layer 180 may include Ti, TiAlN, TaC, TaCN, TaSiN, Mn, Zr, TiN, TaN, Ru, Mo, WN, or any suitable materials. The metal layer 180 may be formed by ALD, PVD, CVD, or other suitable process.

Figure 11A:
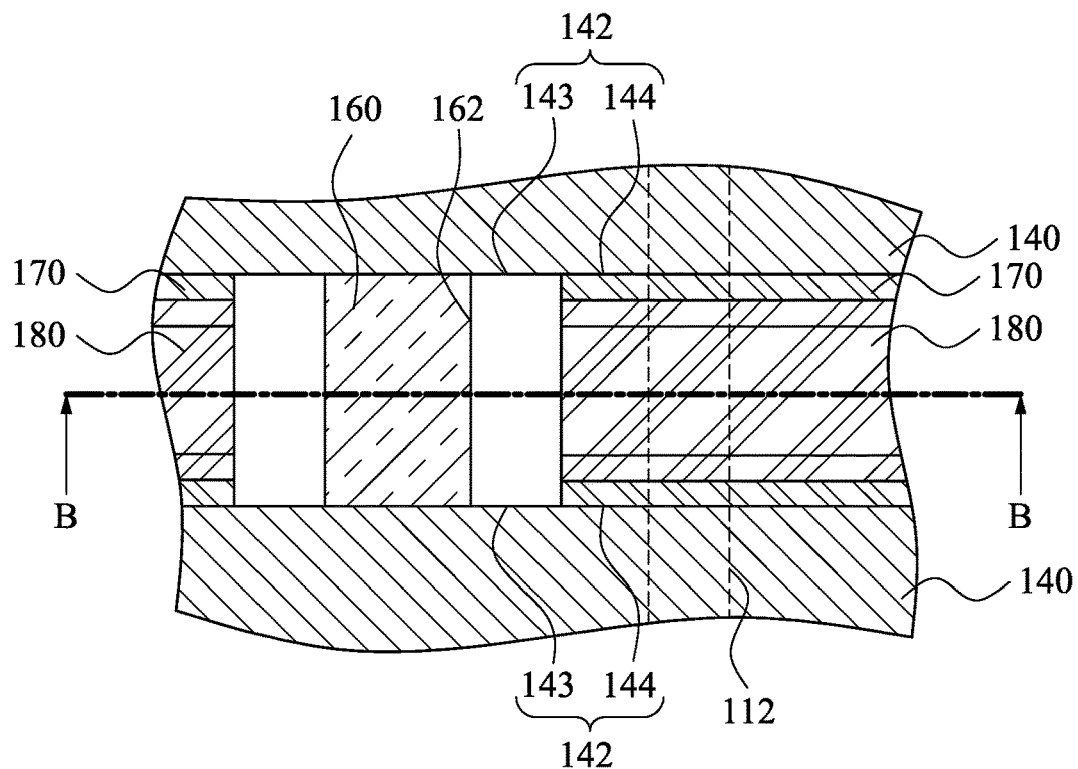
Figure 11B:
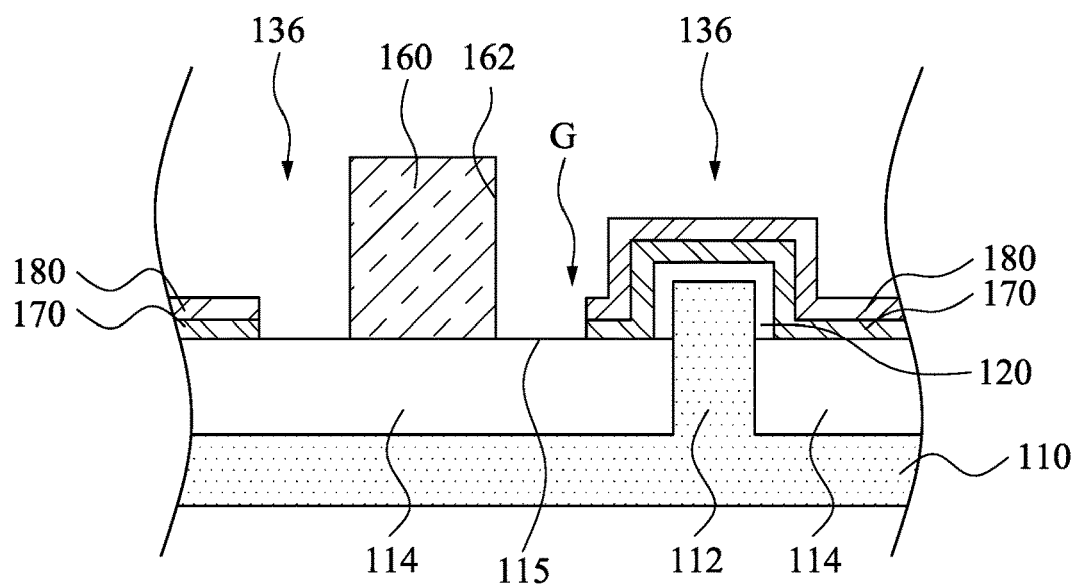

Reference is made to FIGS. 11A and 11B. Subsequently, the high-κ dielectric layer 170 and the metal layer 180 are together partially removed to expose the sidewall 162 of the insulating structure 140, a portion of the bottom surface 115 of the gap G, and the first portions 143 of the sidewalls 142 of the gate spacers 140 while covers second portions 144 of the sidewalls 142 of the gate spacers 140. The first portion 143 of the sidewall 142 of the gate spacer 140 is present adjacent to the sidewall 162 of the insulating structure 160 and between the second portion 144 of the gate spacer 140 and the insulating structure 160. In other words, the high-κ dielectric layer 170 and the metal layer 180 are separated from the insulating structure 160. The high-κ dielectric layer 170 and the metal layer 180 may be partially removed by etching the high-κ dielectric layer 170 and the metal layer 180. The etching process includes dry etch, wet etch, or a combination of dry and wet etch. The etching process may include a multiple-operation etching to gain etch selectivity, flexibility and desired etch profile.

Figure 12A:
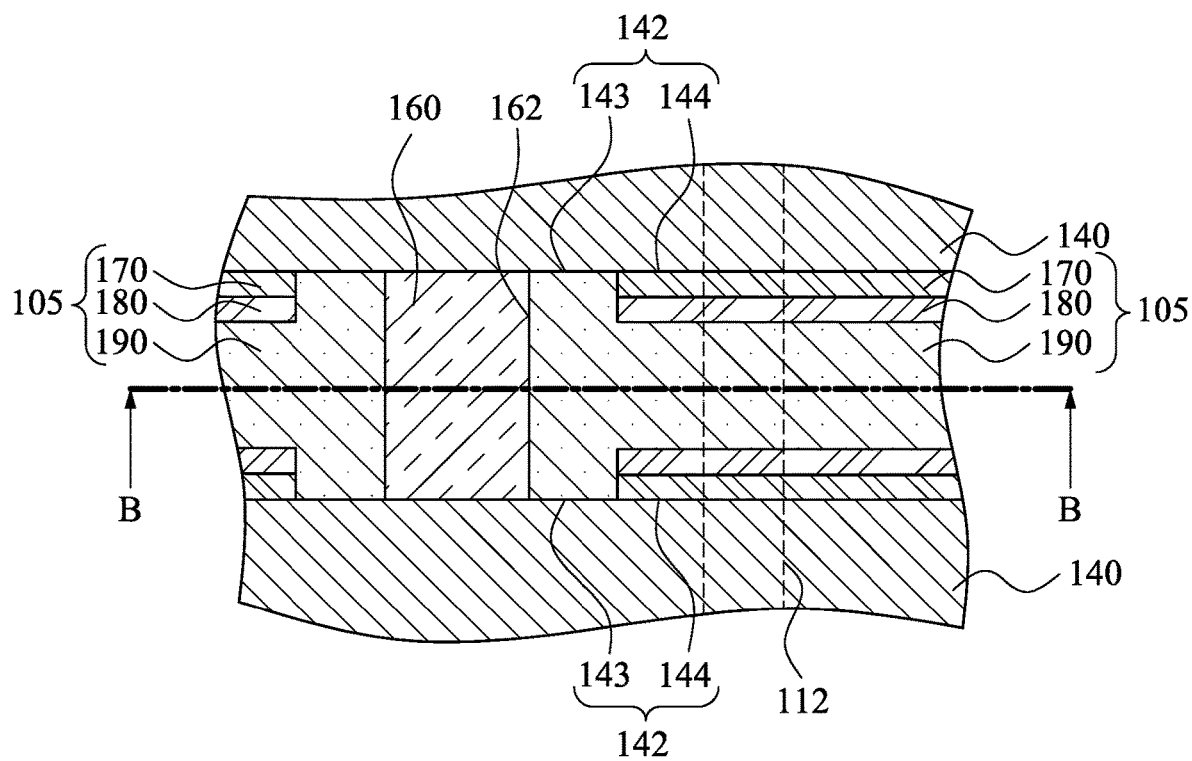
Figure 12B:
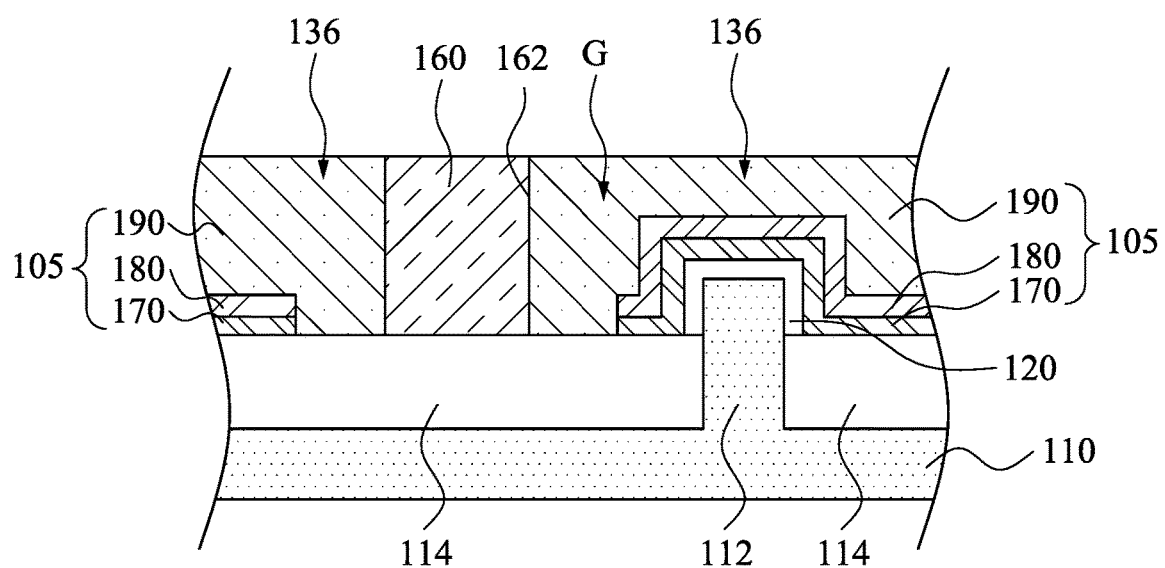

Reference is made to FIGS. 12A and 12B. A gate electrode 190 is formed on the metal layer 180 and is at least disposed in the opening 136. Therefore, the gate electrode 190 attaches to the sidewall 162 of the insulating structure 160, the portion of the bottom surface 115 of the gap G, and the first portions 143 of the sidewalls 142 of the gate spacers 140. Furthermore, the gate electrode 190 fills the gap G between the insulating structure 160 and the semiconductor fin 112. The gate electrode 190 may include aluminum (Al), copper (Cu), AlCu, tungsten (W) or other suitable conductive material. The gate electrode 190 is deposited by ALD, PVD, CVD, or other suitable process. With the gate electrode 190, the metal layer 180, and the high-κ dielectric layer 170, a gate stack 105 is formed. In some embodiments, a metal CMP process is applied to remove excessive the gate electrode 190 to provide a substantially planar top surface for the gate stack 105, the insulating structure 160, and the gate spacer 140. Hence, the gate stack 105 and the semiconductor fin 112 can form a fin field effect transistor (finFET).

According to the aforementioned embodiments, the insulating structure is disposed between two adjacent gate stacks to isolate the two adjacent gate stacks. Since at least a portion of the high-κ dielectric layer and at least a portion of the metal layer covering the sidewall of the insulating structure is removed before the formations of the gate electrode, the depositing windows for the gate electrode is enlarged. In addition, the size of the gap between the insulating structure and the semiconductor fin is also enlarged. Hence, the gate electrode can fill the gap between the insulating structure and the semiconductor fin, reducing the probability of formation of void therein. With this configuration, the voltage performance of the gate stack can be improved.

According to some embodiments, a device includes a substrate, a shallow trench isolation (STI) structure, an isolation structure, and a gate stack. The substrate has a semiconductor fin. The shallow trench isolation (STI) structure over the substrate and laterally surrounding the semiconductor fin. The isolation structure is disposed on a top surface of the STI structure. The gate stack crosses the semiconductor fin, over the STI structure, and in contact with a sidewall the isolation structure, in which the gate stack includes a high-k dielectric layer extending from a sidewall of the semiconductor fin to the top surface of the STI structure and terminating prior to reaching the sidewall of the isolation structure, and in which the high-k dielectric layer is in contact with the top surface of the STI structure. The gate stack includes a gate electrode over the high-k dielectric layer and in contact with the sidewall of the isolation structure.

According to some embodiments, a device includes a substrate, a shallow trench isolation (STI) structure, a gate stack, and gate spacers. The STI structure is over the substrate and laterally surrounding the semiconductor fin. The gate stack crosses the semiconductor fin. The gate stack includes a high-k dielectric layer and a a gate electrode over the high-k dielectric layer, in which the gate electrode has a T-shape profile from a top view. The gate spacers are on opposite sidewalls of the gate stack.

According to some embodiments, a device includes a substrate, a shallow trench isolation (STI) structure, an isolation structure, a gate stack, and gate spacers. The substrate has a semiconductor fin. The shallow trench isolation (STI) structure over the substrate and laterally surrounding the semiconductor fin. The gate stack crosses the semiconductor fin and is adjacent the isolation structure. The gate stack includes a high-k dielectric layer, and a gate electrode over the high-k dielectric layer. The gate spacers are on opposite sidewalls of the gate stack, in which the gate electrode is in contact with the isolation structure and the gate spacers.

The foregoing outlines features of several embodiments so that those skilled in the art may better understand the aspects of the presented disclosure. Those skilled in the art should appreciate that they may readily use the presented disclosure as a basis for designing or modifying other processes and structures for carrying out the same purposes and/or achieving the same advantages of the embodiments introduced herein. Those skilled in the art should also realize that such equivalent constructions do not depart from the spirit and scope of the presented disclosure, and that they may make various changes, substitutions, and alterations herein without departing from the spirit and scope of the presented disclosure.

What is claimed is:
1. A device, comprising:
a substrate having a semiconductor fin;
a shallow trench isolation (STI) structure over the substrate and laterally surrounding the semiconductor fin;
an isolation structure disposed on a top surface of the STI structure; and a gate stack crossing the semiconductor fin, over the STI structure, and in contact with a sidewall of the isolation structure, wherein the gate stack comprises:
  a high-k dielectric layer extending from a sidewall of the semiconductor fin to the top surface of the STI structure and terminating prior to reaching the sidewall of the isolation structure; and
  a gate electrode over the high-k dielectric layer and in contact with the sidewall of the isolation structure.

2. The device of claim 1, wherein the gate stack further comprises a metal layer over the high-k dielectric layer and terminating prior to reaching the sidewall of the isolation structure.

3. The device of claim 2, wherein a sidewall of the metal layer is coterminous with a sidewall of the high-k dielectric layer.

4. The device of claim 2, wherein the gate electrode is in contact with the high-k dielectric layer and the metal layer.

5. The device of claim 1, wherein the gate electrode is in contact with the top surface of the STI structure.

6. The device of claim 1, wherein the gate electrode has a T-shape profile from a top view.

7. The device of claim 1, further comprising gate spacers on opposite sidewalls of the gate stack, wherein the gate electrode is in contact with the gate spacers.

8. The device of claim 7, wherein the gate spacers are in contact with opposite sidewalls of the isolation structure.

9. A device, comprising:
  a substrate having a semiconductor fin;
  a shallow trench isolation (STI) structure over the substrate and laterally surrounding the semiconductor fin;
  a gate stack crossing the semiconductor fin, wherein the gate stack comprises:
    a high-k dielectric layer; and
    a gate electrode over the high-k dielectric layer, wherein the gate electrode has a T-shape profile from a top view; and
  gate spacers on opposite sidewalls of the gate stack.

10. The device of claim 9, wherein the gate electrode is in contact with the gate spacers.

11. The device of claim 9, wherein the gate stack further comprises a metal layer between the high-k dielectric layer and the gate electrode, wherein the gate electrode is in contact with the high-k dielectric layer and the metal layer.

12. The device of claim 9, further comprising an isolation structure on a top surface of the STI structure, wherein the gate electrode is in contact with the isolation structure.

13. The device of claim 12, wherein the gate electrode has a portion laterally between one end of the high-k dielectric layer and a sidewall of the isolation structure.

14. The device of claim 12, wherein the gate spacers are disposed on opposite sidewalls of the isolation structure.

15. A device, comprising:
  a substrate having a semiconductor fin;
  a shallow trench isolation (STI) structure over the substrate and laterally surrounding the semiconductor fin;
  an isolation structure over the STI structure;
  a gate stack crossing the semiconductor fin and adjacent the isolation structure, wherein the gate stack comprises:
    a high-k dielectric layer; and
    a gate electrode over the high-k dielectric layer; and
  gate spacers on opposite sidewalls of the gate stack, wherein the gate electrode is in contact with the STI structure, the isolation structure and the gate spacers.

16. The device of claim 15, wherein the gate stack further comprises a metal layer between the high-k dielectric layer and the gate electrode, and the gate electrode has a portion laterally between one end of the metal layer and a sidewall of the isolation structure.

17. The device of claim 16, wherein the gate electrode is in contact with one end of the high-k dielectric layer.

18. The device of claim 16, wherein from a top view, the gate electrode has a first portion in contact with the gate spacers and a second portion separated from the gate spacers by the high-k dielectric layer and the metal layer.

19. The device of claim 15, wherein a bottom surface of the high-k dielectric layer is level with a bottom surface of the gate electrode.

20. The device of claim 15, wherein the gate stack further comprises a gate insulating film between the semiconductor fin and the high-k dielectric layer.

* * * * *